United States Patent
Shankar et al.

(10) Patent No.: US 8,680,673 B2
(45) Date of Patent: Mar. 25, 2014

(54) INTEGRATED HEAT PILLAR FOR HOT REGION COOLING IN AN INTEGRATED CIRCUIT

(75) Inventors: Ravi Shankar, Singapore (SG); Olivier Le Neel, Singapore (SG)

(73) Assignee: STMicroelectronics Pte Ltd., Singapore (SG)

( * ) Notice: Subject to any disclaimer, the term of this patent is extended or adjusted under 35 U.S.C. 154(b) by 212 days.

(21) Appl. No.: 12/975,194

(22) Filed: Dec. 21, 2010

(65) Prior Publication Data

US 2012/0153358 A1    Jun. 21, 2012

(51) Int. Cl.
H01L 23/34    (2006.01)

(52) U.S. Cl.
USPC ..... 257/720; 257/213; 257/717; 257/E23.083

(58) Field of Classification Search
USPC ............. 257/213, 276, 675, 717, 718, 720, 257/E23.083, E31.051, E23.087, E23.131, 257/E31.131, 705, E33.075; 438/584
See application file for complete search history.

(56) References Cited

U.S. PATENT DOCUMENTS

| | | | |
|---|---|---|---|
| 6,211,569 B1 * | 4/2001 | Lou | 257/758 |
| 6,800,886 B2 * | 10/2004 | Awano | 257/276 |
| 7,545,034 B2 * | 6/2009 | Kim et al. | 257/717 |
| 7,586,191 B2 * | 9/2009 | Hall et al. | 257/720 |
| 7,671,455 B2 * | 3/2010 | Pavier | 257/675 |
| 7,781,884 B2 * | 8/2010 | Ajmera et al. | 257/715 |
| 7,906,836 B2 * | 3/2011 | Chen et al. | 257/675 |
| 2002/0000612 A1 * | 1/2002 | Todd | 257/341 |
| 2006/0237827 A1 * | 10/2006 | Wu et al. | 257/676 |
| 2007/0090522 A1 * | 4/2007 | Alhayek et al. | 257/723 |
| 2009/0148992 A1 * | 6/2009 | Oyu | 438/268 |
| 2011/0278717 A1 * | 11/2011 | Pagaila et al. | 257/737 |

OTHER PUBLICATIONS

Chakrabarty, K. et al., Adaptive Cooling of Integrated Circuits Using Digital Microfluidics, Artech House Publishers, Norwood, Massachusetts, 2007, Chapter 3, "Adaptive Hot-Spot Cooling Principles and Design," pp. 49-76.

Koester, D. et al., "Embedded Thermoelectric Coolers for Semiconductor Hot Spot Cooling," ITHERM '06 10th Intersociety Conference on Thermal and Thermomechanical Phenomena in Electronics Systems, San Diego, California, May 30-Jun. 2, 2006, 491-496.

Laser, D. J. et al., "Silicon Electroosmotic Micropumps for Integrated Circuit Thermal Management," 12th International Conference on Transducers, Solid-State Sensors, Actuators and Microsystems, vol. 1, Boston, Massachusetts, Jun. 8-12, 2003, 151-154.

(Continued)

*Primary Examiner* — Cuong Q Nguyen
*Assistant Examiner* — Yosef Gebreyesus
(74) *Attorney, Agent, or Firm* — Seed IP Law Group PLLC

(57) ABSTRACT

The thermal energy transfer techniques of the disclosed embodiments utilize passive thermal energy transfer techniques to reduce undesirable side effects of trapped thermal energy at the circuit level. The trapped thermal energy may be transferred through the circuit with thermally conductive structures or elements that may be produced as part of a standard integrated circuit process. The localized and passive removal of thermal energy achieved at the circuit level rather just at the package level is both more effective and more efficient.

18 Claims, 9 Drawing Sheets

(56) References Cited

OTHER PUBLICATIONS

Snyder G. J. et al., "Hot Spot Cooling using Embedded Thermoelectric Coolers," 22nd Annual IEEE Semiconductor Thermal Measurement and Management Symposium, Dallas, Texas, Mar. 14-16, 2006, pp. 135-143.

Intel Thermal Mechanical Design Guide for Intel Core 2 Extreme Processor X6800 and Intel Core 2 Duo Desktop Processor E6000 and E4000 Sequences, Oct. 2007, 122 pages.

Ansys 10.0 Reference Guide, Aug. 2005, 1085 pages.

* cited by examiner

INTEGRATED HEAT PILLAR FOR HOT REGION COOLING IN AN INTEGRATED CIRCUIT

BACKGROUND

1. Technical Field

The present disclosure generally relates to cooling integrated circuits.

2. Description of the Related Art

Semiconductor circuits that are subjected to undesirable quantities of thermal energy may operate differently than designed, may malfunction, or may fail. As a result, the distribution of thermal energy in a circuit can be of great interest to a manufacturer.

Heat is thermal energy in the process of transfer or conversion across a boundary of one region of matter to another. Thermal energy is the total amount of kinetic energy in a substance, whereas temperature is a measure of the average of kinetic energy in the substance. In heat transfer, conduction is the transfer of thermal energy in a substance due to a temperature gradient. Heat transfer always goes from a region of higher temperature to a region of lower temperature, and acts to equalize the temperature difference.

One source of heat in a system is power dissipation. The power dissipated in a resistor can be calculated as function of the resistance of the resistor and the current flowing thought the resistor, i.e., $P=I^2R$. The power dissipated in a resistor goes into heating the resistor; this is known as Joule heating. Because any circuit component having a resistance and current flowing through it will dissipate power and result in Joule heating, many circuits must take heating issues into consideration.

Several popular methods of channeling heat at the package level exist, but many of them consume power in the process. Examples, include thermoelectric cooling, integrated micro pumps inside the silicon substrate below the high power region of integrated circuits, fluid-based cooling of hot regions of integrated circuits, and heat sink-based cooling from the casing of integrated circuits.

BRIEF SUMMARY

The passive thermal energy transfer techniques of the herein disclosed embodiments of the invention utilize passive thermal energy transfer techniques to reduce undesirable side effects of trapped thermal energy at the circuit-level.

Localized removal of thermal energy achieved by circuit design modification rather than package level modification is generally more efficient. The efficiency difference is more easily understood in context of examples of thermal effects on a circuit. For example, the random motion of electrons due to thermal effects adds thermal noise to resistive communication structures. As another example, the temperature of a poly-poly capacitor may vary on the order of 20 ppm/° C., so the ability to redirect heat from a particular capacitor may effectuate tighter capacitive tolerances. As a another example, both carrier mobility and threshold voltages in MOSFETs are temperature dependent, so the current flowing through any MOSFET will be positively impacted by the ability to passively and substantially transfer heat from regions of thermal concern. The ability to position a thermal energy transfer structure at location of trapped thermal energy enables a manufacturer to target specific areas of concern rather than attempting to cool an entire circuit or chip.

In one embodiment of the invention, a thermally conductive pillar is positioned between a substrate and a metal layer. The thermally conductive pillar may be positioned within an electrical insulation layer and may exhibit dielectric properties similar to the surrounding electrical insulation. While electrical insulators generally impede the dissipation of thermal energy, the thermally conductive pillar may comparatively transfer thermal energy rather well.

The thermally conductive pillar may be used to transfer thermal energy from one region of a circuit to another. The pillar may be used to transfer thermal energy from a metal layer to a substrate, from the substrate to the metal layer, or from a first section of substrate to a second section of substrate via the metal layer. The pillar may comprise several sections that span several insulation layers, or it may comprise a single section.

The pillar may be formed of one or more layers of material having different properties to improve thermal conductivity. For example, the pillar may comprise an electrically conductive layer and an electrically nonconductive layer and still maintain its dielectric properties.

A passive heat transfer structure, such as the one disclosed, offers several advantages. Because the advantage of thermal conductivity comes from the material used for the thermally conductive pillar, the choice of material may be delayed until process integration of the device. Additionally, thermal energy may be transferred from one place to another inside a device without power consumption. This technique therefore offers significant advantages over heat pumps and thermal electric cooling. Furthermore, the manufacturing process integrates the fabrication of the pillar at the mask level, so the pillar may be positioned to remove heat from a specific location or spot in the integrated circuit. As a result, thermal energy transfer is more efficient that attempts at reducing the temperature of an entire circuit, die, or package.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. Further, some figures are in schematic form and the particular shapes of some of the elements as drawn might not convey information regarding the actual shape of the particular elements and have been selected for ease of recognition in the drawings.

Figure 1:
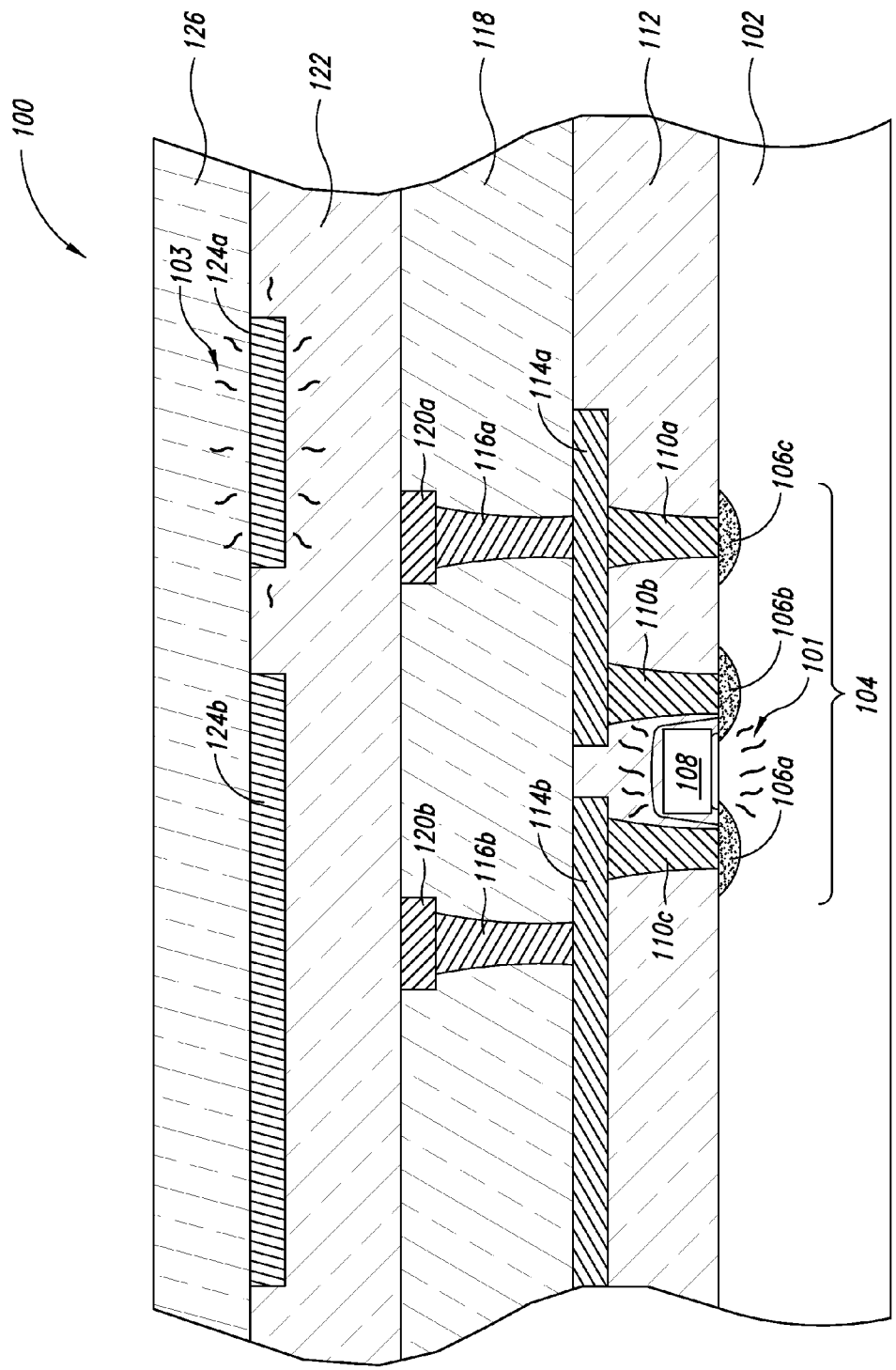
FIG. 1 is a simplified diagram illustrating potential sources of thermal energy in a semiconductor structure formed on a substrate, according to an embodiment of the invention.

In the drawings, identical reference numbers identify similar elements or acts. The sizes and relative positions of elements in the drawings are not necessarily drawn to scale. For example, the shapes of various elements and angles, and some of the elements are enlarged and positioned to improve understanding of the inventive features.

DETAILED DESCRIPTION

In the description provided herewith, certain specific details are set forth in order to provide a thorough understanding of various disclosed embodiments. However, one skilled in the relevant art will recognize that embodiments may be practiced without one or more of these specific details, or with other methods, components, etc. In some instances, well-known structures or processes associated with fabrication of MEMS have not been shown or described in detail to avoid unnecessarily obscuring descriptions of the inventive embodiments.

Unless the context requires otherwise, throughout the specification and claims that follow, the words "comprise" and "include" and variations thereof, such as "comprises," "comprising," and "including," are to be construed in an open, inclusive sense, that is, as meaning "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

As used in the specification and appended claims, the use of "correspond," "corresponds," and "corresponding" is intended to describe a ratio of or a similarity between referenced objects. The use of "correspond" or one of its forms should not be construed to mean the exact shape or size.

FIG. 1 illustrates a semiconductor device 100, according to one embodiment of the invention. The semiconductor device 100 includes a substrate 102, an active device 104, active regions 106a-106c, a gate 108, conductive plugs 110a-110c, insulating layer 112, a first metal layer including metal lines 114a and 114b, conductive plugs 116a-116b, insulating layer 118, a second metal layer including metal lines 120a-120b, insulating layer 122, a third metal layer including metal lines 124a-124b, and insulating layer 126.

Two areas of potentially trapped thermal energy are highlighted within the illustration of semiconductor device 100, i.e., heat source 101 and heat source 103. In one embodiment, the active device 104 may be a field effect transistor ("FET") including active regions 106a-106c, gate 108, and heat source 101 may encompass a region of the substrate 102 proximate to the channel of the active device 104. Heat source 101 may also encompass the gate 108 and a region of insulating layer 112 surrounding the gate 108. The precision with which the active device functions may decrease as a result the heat source 101. For example, the thermally dependent electron mobility of the channel and the thermally dependent threshold voltage between the gate 108 and the active region 106b (source) of the active device 104 may be increased or decreased, thereby altering operational characteristics of the active device 104.

Heat source 101 may be generated as a result of power dissipated by the active device 104. In one embodiment, the power dissipated by the active device 104 may come from current flowing through the resistive channel of the active device 104. Because dissipated power is proportional to the resistance of the channel and the square of the current flowing through the channel, i.e., $P=I^2R$, devices positioned in high current paths may be more susceptible to generating and trapping undesirable thermal energy. Undesirably stagnant thermal energy not only influences the operating parameters of the active device 104 but may also contribute to premature break-down of physical structures, such as the conductive plugs 110b and 110c.

In one embodiment, the active device 104 may be configured to function as a capacitor and the heat source 101 may be a product of electric fields rapidly alternating across the gate stack of the device.

Heat source 103 may encompass a section of metal line 124a. Circuit manufacturing continues to trend toward smaller processes to produce smaller chips. In conformity with the goal to produce overall smaller chips, the size of metal lines is also trending to smaller cross sectional dimensions. Since the resistance of a metal line is inversely proportional to the cross-sectional area (A) of the line, i.e., $R=(\rho \cdot l)/A$, line resistance increases with decreasing cross-sectional area dimensions. Consequently, a current flowing through a reduced cross-sectional dimension results in more power dissipated as heat.

The insulating layers 112, 118, 122, and 126 typically insulate, and therefore impede, both electrical and thermal energies from diffusing between adjacent regions in a circuit. Typically, metal-to-substrate insulating layer 112 and metal-to-metal insulating layers 118, 122, and 126 are formed from silicon dioxide $SiO_2$. Silicon dioxide effectively resists currently flow when compared to metal. By way of comparison, silicon dioxide has a high electrical resistivity of $1\times10^{13}$ $\Omega \cdot m$ whereas copper has a low electrical resistivity of 17.1 $n\Omega \cdot m$. Accordingly, silicon dioxide is millions of times more electrically resistive than copper.

Silicon dioxide also effectively impedes the diffusion of thermal energy when compared to metal. To illustrate, air is considered one of the best thermal insulators and has a thermal conductivity of 0.024 W/(K·m). Silicon dioxide has a relatively low thermal conductivity of 1.38 W/(K·m), and copper has a thermal conductivity of 390 W/(K·m). Accordingly, silicon dioxide is more than 282 times less thermally conductive than copper. Consequently, the insulating layers 112, 118, 122, and 126 effectively insulate electrical energy transfer while simultaneously trapping thermal energies.

An understanding of the thermal and electrical properties of the semiconductor device is important for understanding how to mitigate the effects of heat sources 101 and 103 on the semiconductor device 100.

FIGS. 2A-2E illustrates a process of fabricating a thermally conductive pillar 204, according to one embodiment of the invention. As described below, the process integrates the fabrication of the pillar 204 at the mask level, enabling the fabrication of the pillar 204 without substantial alteration to a standard integrated circuit process.

Figure 2A:
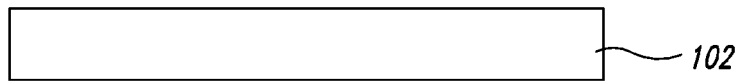
FIGS. 2A-2E are diagrams illustrating a semi-conductor process used to form a thermally conductive pillar, according to an embodiment of the invention.

FIG. 2A illustrates the silicon substrate 102. A typical crystalline silicon substrate 102 is hundreds of microns thick and is the base upon which semiconductor devices are formed. By contrast, metal line thickness may range between 0.3 um and 1.8 um; insulating layer thickness may range between 0.5 um and 5 um; and gate stack heights may range between 0.110 um to 0.200 um. Because of its comparative size and thickness, some regions of the substrate 102 can be advantageously useful for receiving undesirable thermal energy. That is, the substrate 102 may be used to dissipate thermal energy throughout its large volume as a heat sink.

Figure 2B:
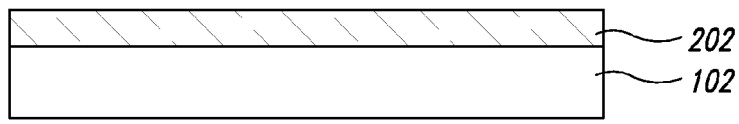

FIG. 2B illustrates an electrical insulator 202 overlying silicon substrate 102. A typical metal-to-substrate or metal-to-metal insulator 202 includes silicon dioxide $SiO_2$. The silicon dioxide may be applied using any one of a number of techniques, such as physical vapor deposition.

Figure 2C:
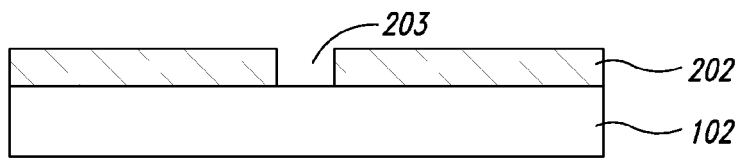

FIG. 2C illustrates an opening 203 etched into electrical insulator 202. The opening 203 may be etched in a variety of patterns in preparation for the subsequently deposited pillar. For example, the opening 203 may be etched into a pattern that at least part of a subsequently deposited metal layer may take. Alternatively, a top view of the opening 203 may be etched into approximately the shape of a rectangle, square, oval, circle, polygon, or other customized shape.

Figure 2D:
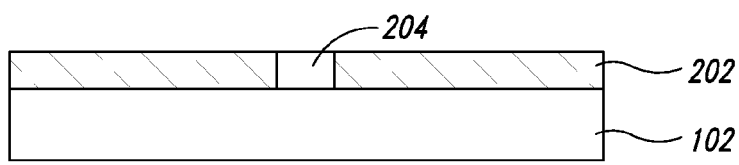

FIG. 2D illustrates a thermally conductive pillar 204 deposited into the opening 203. The thermally conductive pillar 204 is formed to be electrically nonconductive. The thermally conductive pillar 204 may be thermally conductive and have a thermal conductivity which is greater than the thermal conductivity of the electrical insulator 202. In one embodiment, the thermally conductive pillar 204 comprises silicon nitride $Si_3N_4$. Silicon nitride may have a thermal conductivity of approximately 30 W/(K·m). Thus, the thermally conductive pillar 204 formed from silicon nitride would be over 20 times more thermally conductive than the surrounding electrical insulator 202 having a thermal conductivity of only 1.38 W/(K·m). Alternatively, the thermally conductive pillar 204 may comprise a diamond-like carbide or silicon carbide. Having a thermal conductivity of 120 W/(K·m), silicon carbide is in excess of 80 times more thermally conductive than silicon dioxide. As will be discussed in further detail later, the thermally conductive pillar 204 may be formed from a combination of an electrically conductive layer and an electrically nonconductive layer to transfer heat from one area to another, according to one embodiment.

Figure 2E:
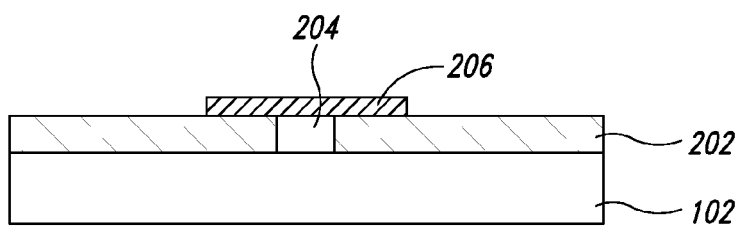

FIG. 2E illustrates a metal line 206 disposed over the thermally conductive pillar 204 and the electrical insulator 202. The metal line 206 may include any one of or combination of aluminum, copper, gold, cobalt, titanium, or the like. The coupling of the metal line 206 with the substrate 102 via the thermally conductive pillar 204 facilitates the transfer of thermal energy between the metal line 206 and the substrate 102.

The structure in the disclosed process offers several advantages. Because the advantage of thermal conductivity comes from the material used for the thermally conductive pillar 204, the choice of material may be delayed until process integration of the device. Additionally, thermal energy may be transferred from one place to another inside a device without power consumption. This technique therefore offers significant advantages over heat pumps and thermal electric cooling. Furthermore, because the process shown and described in FIGS. 2A-2E integrates the fabrication of the pillar 204 at the mask level, the pillar 204 may be positioned to remove heat from a specific location or spot in the integrated circuit.

Figure 3A:
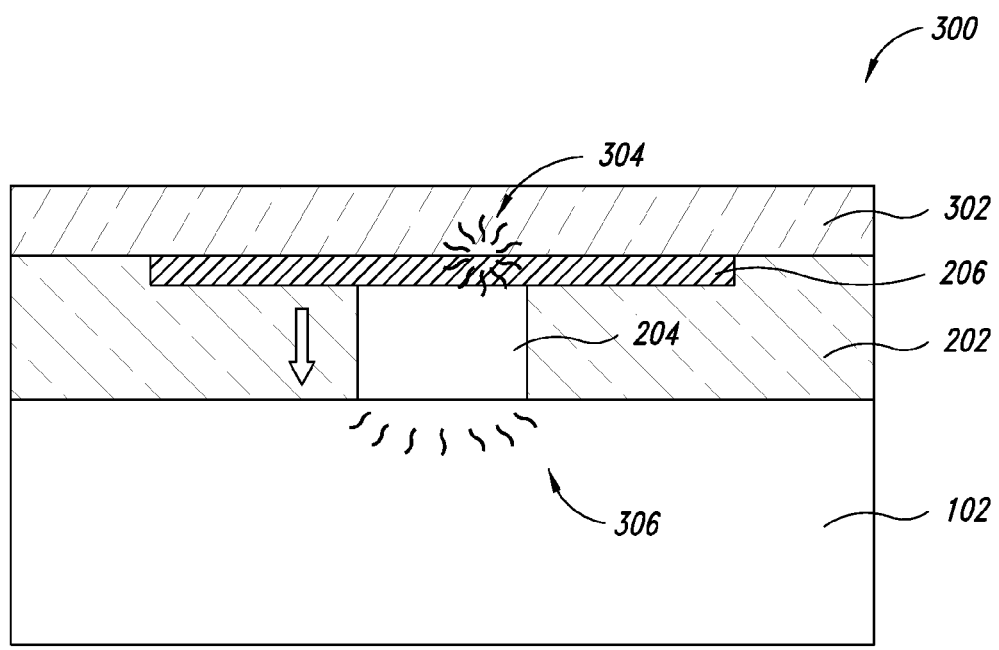
FIGS. 3A-3B are diagrams illustrating a transfer of thermal energy using a thermally conductive pillar, according to one embodiment of the invention.

FIG. 3A illustrates a heat transfer device 300, according to one embodiment of the invention. The heat transfer device 300 includes the substrate 102, the electrical insulator 202, the thermally conductive pillar 204, the metal line 206, and an electrical insulator 302. The heat transfer device 300 also illustrates a heat source 304 and heat dissipation 306.

The heat source 304 originates in the metal line 206. Heat may become concentrated in metal layers where the current density is high. For example, the metal line 206 may be connected to a terminal of a chip, such as a power terminal, that is configured to source or sink hundreds of milli-amps. In such case, even though the metal line 206 has the low electrical resistivity of a conductor, the power dissipated in the metal line 206 may result in undesirable thermal energy traps such as heat source 304.

The heat transfer device 300 enables thermal energy to diffuse to a location on the semiconductor device where it may be more readily dissipated. The thermal energy of heat source 304 is transferred through the coupling with thermally conductive pillar 204. The transferred thermal energy may be dissipated into a region of the substrate 102 where the temperature of the substrate 102 is less than the metal line 206 producing the heat source 304.

The composition of thermally conductive pillar 204 enables the pillar to transfer thermal energy to a region of the substrate 102 while maintaining current impedance between the metal line 206 and the region of the substrate 102 the thermal energy is being transferred to. In one embodiment, the thermally conductive pillar 204 may comprise silicon nitride $Si_3N_4$. By way of comparison, the thermal conductivity of silicon nitride is 30 W/(K·m), while the thermal conductivity of the typically used thermal insulator, silicon dioxide, is only 1.38 W/(K·m). Thus, the thermal conductivity of silicon nitride is approximately 21 times greater than silicon dioxide. Advantageously, the electrical resistivity is relatively similar. The electrical resistivity of silicon nitride is on the order of $10^{12}$ Ω·m, while the electrical resistivity of silicon dioxide is on the order of $10^{13}$ Ω·m. Thus, the thermally conductive pillar 204 enables passive thermal energy transfer while continuing to impede current from potentially flowing into the substrate.

Figure 3B:
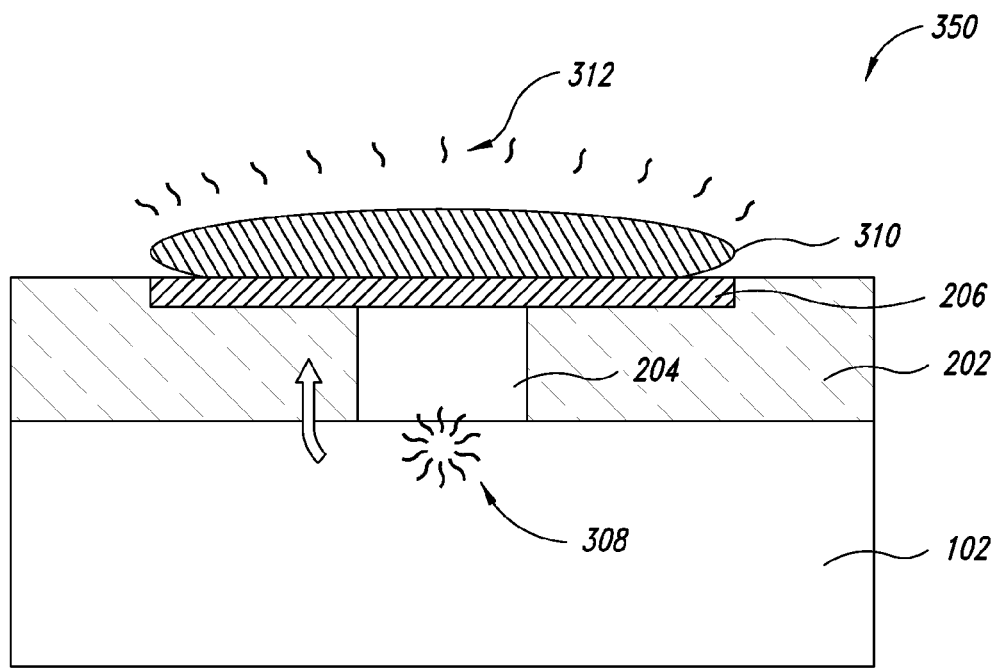

FIG. 3B illustrates a heat transfer device 350, according to an embodiment of the invention. The heat transfer device 350 includes several of the features of heat transfer device 300 and additionally includes a conductive bump 310, a heat source 308, and heat dissipation 312. According to one embodiment, the heat source 308 is generated in the substrate 102. Heat source 308 may be a product of components such as active area resistors formed in the substrate, power dissipated by channels of transistors such as MOSFETs or JFETs, or current being injected into the substrate as a result of capacitive coupling to conductors carrying high-frequency signals.

The heat transfer device 350 dissipates thermal energy into ambient air. The heat source 308 dissipates through the thermally conductive pillar 204 through proximity of the thermally conductive pillar 204 with the substrate 102. The thermal energy then dissipates from the thermally conductive pillar 204 to the metal line 206. As discussed previously, the thermal conductivity of copper, a commonly used conductor, is 390 W/(K·m). Thus, copper transfers thermal energy approximately 13 times better than silicon nitride and over 280 times better than silicon dioxide. The metal line 206 and the conductive bump 310 are conductors which may comprise copper, aluminum, or the like, and therefore readily transfer thermal energy both from the thermally conductive pillar 204 and between each other.

The thermal energy transferred from the heat source 308 to the conductive bump 310 is radiated into ambient air as heat dissipation 312. Air is a poor thermal conductor having a thermal conductivity of approximately 0.025 W/(K·m). However, according to one embodiment, the radiation of heat dissipation 312 by conductive bump 310 is improved by using a fan to continuously displace the air into which heat dissipation 312 is radiated. Alternatively, a liquid-based heat exchanger may be employed to transfer thermal energy from the conductive bump 310.

Figure 4A:
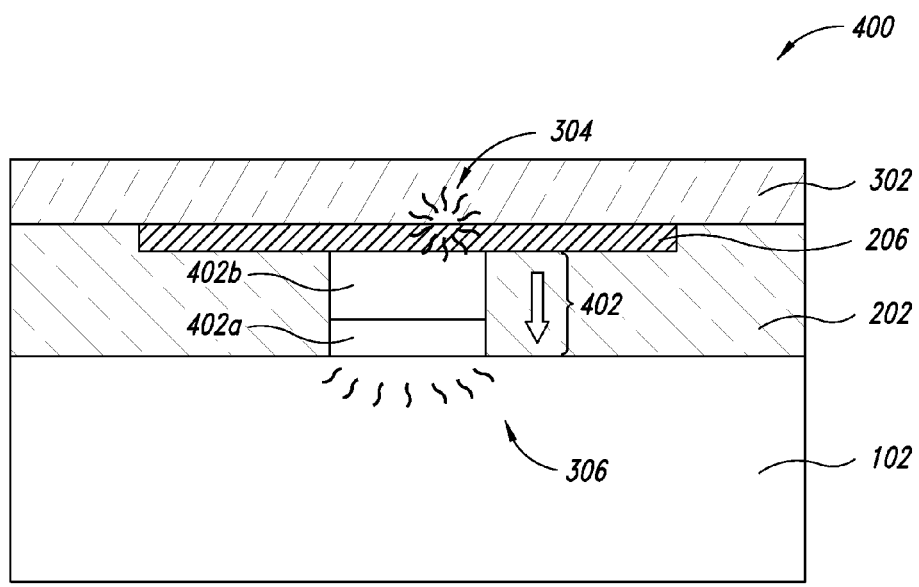
FIGS. 4A-4B are diagrams illustrating a transfer of thermal energy using a thermally conductive pillar, according to another embodiment of the invention.
Figure 4B:
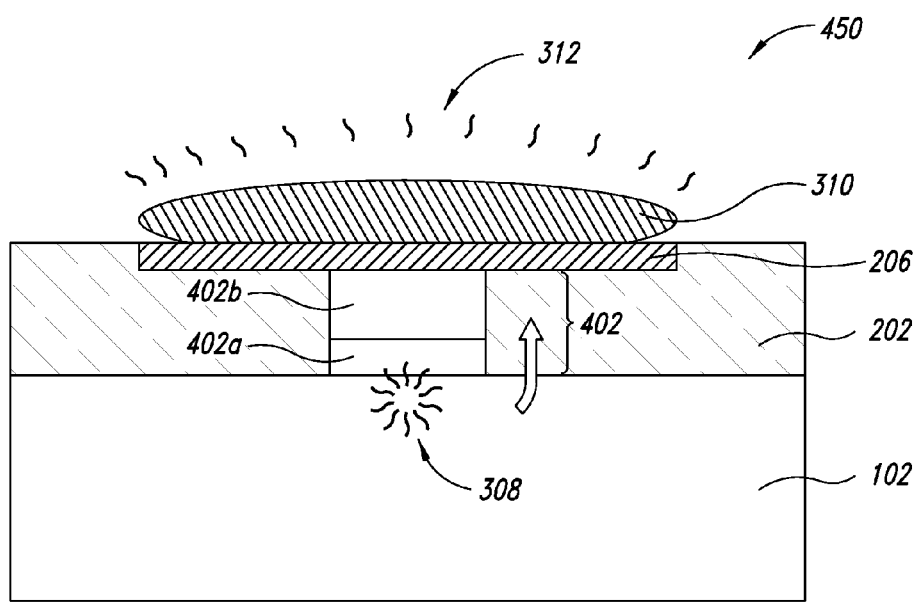

FIGS. 4A and 4B illustrate heat transfer devices 400 and 450, in accordance with embodiments of the invention. The heat transfer devices 400 and 450 include a thermally conductive pillar 402. Previously introduced aspects of FIGS. 4A and 4B are herein omitted. Further, for the following embodiments, descriptions for the same or similar portions are not repeated, in principle, except for the case where they are particularly necessary.

The thermally conductive pillar 402 includes a first thermally conductive layer 402a and a second thermally conductive layer 402b. The first thermally conductive layer 402a may comprise an electrically nonconductive and thermally conductive material such as silicon nitride. The second thermally conductive layer 402b may comprise a more thermally conductive and less electrically resistive material such as polysilicon. Because polysilicon has a thermal conductivity of 149 W/(K·m), polysilicon is approximately 50 times more thermally conductive than silicon nitride (30 W/(K·m)). The combination of the first thermally conductive layer 402a and the second thermally conductive layer 402b therefore results in a more thermally conductive pillar 402 than the thermally conductive pillar 204, which may substantially comprise a material such as silicon nitride.

Controlling the thickness of first thermally conductive layer 402a (not electrically conductive) may mitigate the potential increased risk for current injection into the substrate 102 via the multilayered thermally conductive pillar 402. Capacitive coupling between two conductors separated by an electrical insulator (dielectric) occurs according to $C=(\in \cdot A)/t$, where $\in$=permittivity, A is the area of the conductors, and t is the thickness of the dielectric separating the conductors. Because the second thermally conductive layer 402b may be placed adjacent to the metal line 206 above the first thermally conductive layer 402a or the second thermally conductive layer 402b may be placed adjacent to the silicon substrate 102 below the first thermally conductive layer 402a, the second thermally conductive layer 402b may effectively reduce the electrical separation between the metal line 206 and the silicon substrate 102. Accordingly, the thickness t of the first thermally conductive layer 402a may be determined based upon the amount of capacitive decoupling needed by the individual circuit.

In one embodiment, the first thermally conductive layer 402a comprises polysilicon while the second thermally conductive layer 402b comprises silicon nitride. In another embodiment, the second thermally conductive layer 402b comprises a highly thermally conductive material such as copper, so as to substantially increase the thermal conductivity of the thermal pillar 402.

Figure 5:
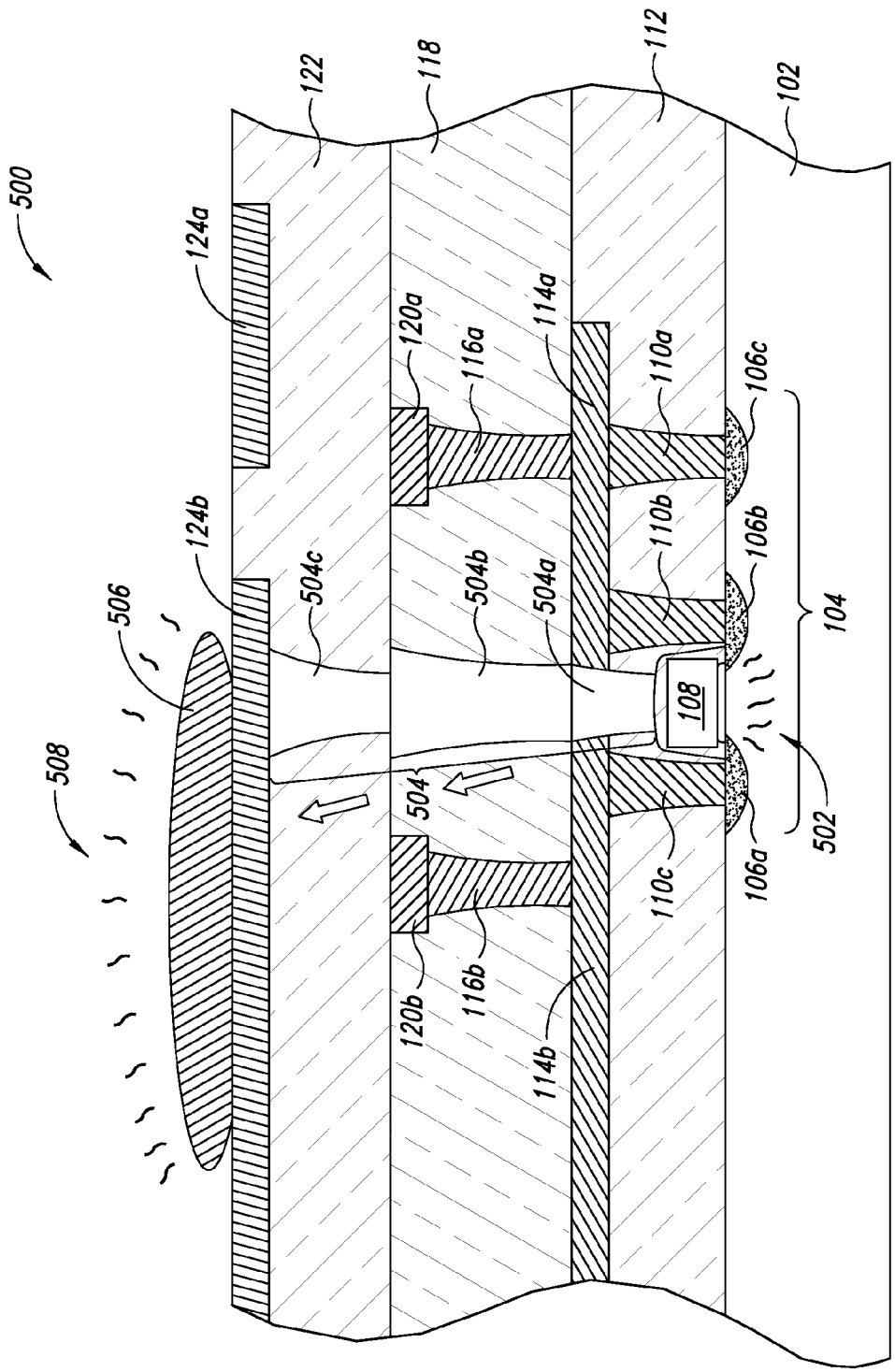
FIGS. 5-8 are diagrams of a semiconductor-based device illustrating the transfer of thermal energy using thermally conductive pillars, according to several embodiments of the invention.

FIG. 5 illustrates a diagram of a heat transfer structure 500 for removing thermal energy from the active device 104. In addition to the features introduced with heat transfer structure 100, the heat transfer structure 500 includes a heat source 502, a thermally conductive pillar 504, a conductive bump 506, and produces heat dissipation 508.

The heat source 502 is generated around active device 104. In one embodiment, active device 104 is an n-channel MOSFET. When a voltage is applied to the gate 108, the MOSFET 104 may be turned on, i.e., its channel is inverted with charge carriers. The inverted channel of MOSFET 104 permits current to flow between the active region 106a (drain) and the active region 106b (source). The power dissipated by the channel of the MOSFET 104 is proportional to the resistance of the channel and the square of the quantity of current flowing through the channel. If, for example current flowing between the active region 106a (drain) and the active region 106b (source) were 150 mA, and the resistance of the channel was 3.4 kΩ, the MOSFET 104 may dissipate up to 76 W of power. As a result, the temperature at the substrate 102 under the MOSFET 104 as well as the temperature at the gate 108 will increase according to the inability of the thermal energy to diffuse to cooler areas of the circuit.

The thermally conductive pillar 504 may be positioned proximate to the active device 104 to transfer the thermal energy away from the heat source 502. The thermally conductive pillar 504 may include thermally conductive pillar section 504a, thermally conductive pillar section 504b, and thermally conductive pillar section 504c. In one embodiment, the thermally conductive pillar 504 may be a single section.

According to one embodiment, the thermally conductive pillar section 504a may be deposited over the gate 108 of active device 104. The thermally conductive pillar section 504a may be formed in accordance with the process shown and described with respect to FIGS. 2A-2E. In one embodiment, the thermally conductive pillar section 504a is formed after the metal lines 114a and 114b. In another embodiment, a first portion of the thermally conductive pillar section 504a is deposited prior to the deposition of metal lines 114a and 114b, and a second portion of the thermally conductive pillar section 504a is formed during the deposition of metal lines 114a and 114b.

The thermally conductive pillar section 504a may be positioned between conductive plugs 110b and 110c while overlying the active device 104. In another embodiment, the thermally conductive pillar 504 is connected directly to the substrate to transfer thermal energy to bump 506.

Thermally conductive pillar section 504b may be formed over the thermally conductive pillar section 504a. An opening is formed in insulation layer 118, and the thermally conductive pillar section 504b is deposited therein. In one embodiment, the thermally conductive pillar section 504b is isolated from the metal layer 120.

The thermally conductive pillar section 504c is positioned between the thermally conductive pillar section 504b and the metal line 124b. Pillar section 504c may be formed as an electrically nonconductive thermal conductor prior to the deposition of metal line 124b. In one embodiment, the thermally conductive pillar section 504c is formed during the deposition of metal line 124b. Accordingly, the thermally conductive pillar section 504c may comprise the metal used to form metal line 124b.

Conductive bump 506 is formed over metal line 124b. The conductive bump 506 may comprise copper, aluminum, gold, or the like. The conductive bump 506 radiates the thermal energy it receives via the thermally conductive pillar 504. The conductive bump 506 may be exposed to ambient air, in which case the received thermal energy is radiated as dissipated heat 508.

An exemplary device which may incorporate the heat transfer structure 500 is the STM32F101 series of ARM processors manufactured by ST Microelectronics. Some of the STM32F101 series of ARM processors are rated to source and sink approximately 150 mA at the power and ground terminals. A 150 mA current passing through a MOSFET having a channel resistance of approximately 3.4 kΩ in the path of current flow would result in heat produced by up to 76 W of power.

In one embodiment, the heat transfer structure 500 is implemented in a 32 nm process.

Figure 6:
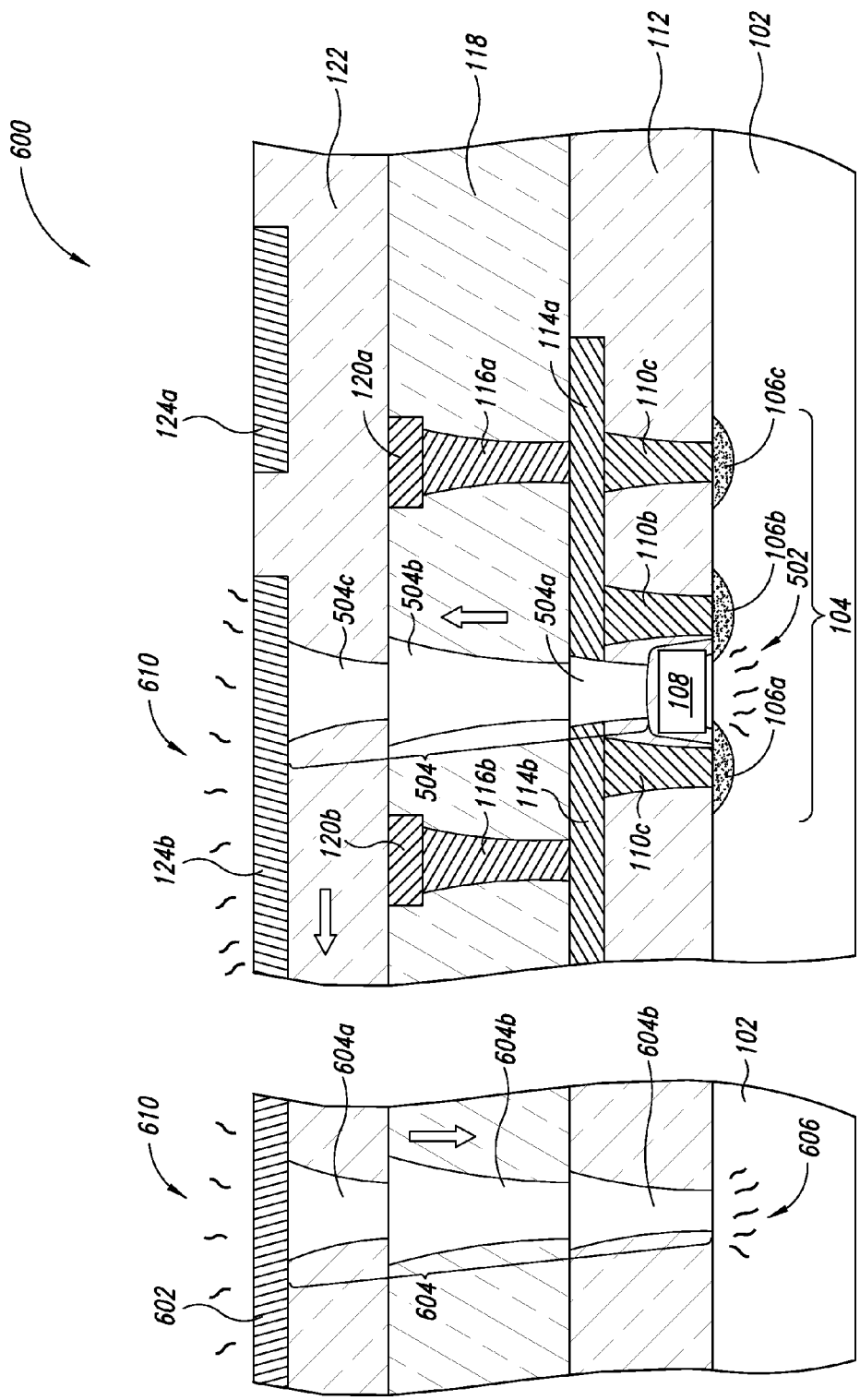

FIG. 6 illustrates a diagram of a heat transfer structure 600 for removing thermal energy from the active device 104, according to an embodiment of the invention. In addition to features which have already been described, the heat transfer structure 600 includes metal line 602, thermally conductive pillar 604, and results in heat dissipation 606, and heat dissipation 610.

Rather than directing heat source 502 to the conductive bump 508 (not shown), the heat source 502 may be directed to a region of silicon having a lower average temperature. The thermally conductive pillar 504 may be coupled between the gate 108 of the active device 104 and the metal line 124b. Thermal energy trapped in the proximity of the active device 104 may be transferred through the thermally conductive pillar 504 to the metal line 124b.

From the metal line 124b, the thermal energy may be transferred to a metal line 602, which is coupled to the metal line 124b. The metal line 602 may be the same as metal line 124b. Alternatively, metal line 602 may comprise a metal layer that is deposited either before or after the metal line 124b. The high thermal conductivity of electrical conductors enables a substantial portion of the thermal energy from the metal line 124b to be received at the metal line 602. In one embodiment, metal lines 124a, 124b, and 602 are formed from the top metal level and thermal energy is radiated as heat dissipation 610. Top metal levels are commonly formed with a thickness that is 2-5 times the thickness of lower metal levels. Metal lines 124a, 124b, and 602 may be 1.5-5.0 um thick.

The thermal energy received at metal line 602 is transferred to the silicon substrate 102 via the thermally conductive pillar 604. The thermally conductive pillar 604 is coupled between the metal line 602 and the silicon substrate 102, and includes a thermally conductive pillar section 604a, a thermally conductive pillar section 604b, and a thermally conductive pillar section 604c. The individual sections of the heat pillar 604 may be formed in a manner similar to that which was described for heat pillar 504. Additionally, at least two of the sections of the heat pillar 604 may comprise an electrical conductor, according to one embodiment of the invention. For example the thermally conductive pillar 604a may comprise an electrically nonconductive thermal conductor such as silicon nitride, and thermally conductive pillar sections 604b and 604c may comprise tungsten, copper, or the like. A thusly formed thermally conductive pillar 604 would have a higher thermal conductivity than a pillar formed with less or without any conductive sections. In other embodiments, the thermally conductive pillar 604 comprises more or less sections than what is illustrated and comprises more or less electrically conductive sections.

Thermally conductive heat pillar 604 may be positioned so as to transfer heat dissipation 606 to a variety of regions on a chip. For example, the thermally conductive pillar 604 may be positioned so as to result in heat dissipation 606 near or within the remainder of a scribe line after die separation. Scribe lines are regions of silicon wafers that are regularly used for placing test structures and devices. Some scribe lines are on the order of 10 µm wide. Scribe saw blades are approximately 3 µm wide. When the die constituting a silicon wafer are separated at the scribe line region, an amount of substantially unused scribe line region remains even after scribe saw blade placement error is accounted for. The remaining scribe line region may range anywhere from 0.5 µm to 5 µm, or more. This substantially unused remaining scribe line region may be used for positioning thermal pillars such as thermally conductive pillar 604 to transfer heat dissipation 606 into a less-used region of the substrate 102.

In one embodiment, the thermally conductive pillar 604 is not positioned in a scribe line region, but is instead positioned in another less thermally active region of the die.

Figure 7:
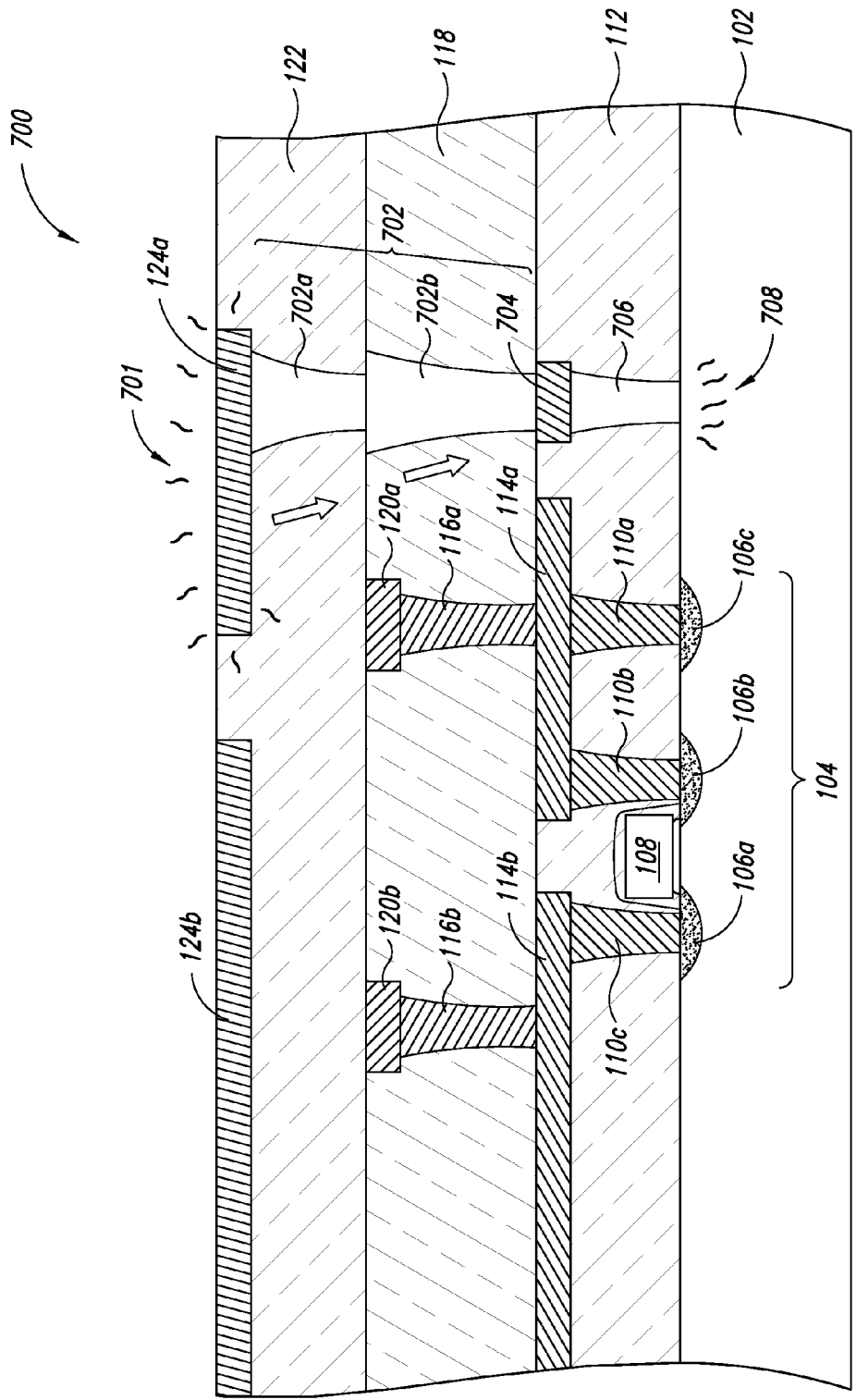

FIG. 7 illustrates a diagram of a heat transfer structure 700, in accordance with an embodiment of the invention. In addition to the features which have already been introduced, the heat transfer structure 700 includes a heat source 701, thermally conductive pillar 702, metal line 704, thermally conductive pillar 706, and results in heat dissipation 708.

Thermally conductive pillar 702 includes thermally conductive pillar section 702a and a thermally conductive pillar section 702b. The sections of the thermally conductive pillar 702 may comprise a material which is electrically nonconductive and thermally conductive, e.g., silicon nitride. In one embodiment, one of the sections comprises a conductor, such as copper. In another embodiment, one or more of the sections include a layer of electrically conductive material a layer of electrically nonconductive material. The sections of the thermally conductive pillar 702 may be formed at simultaneously or during different process steps. If formed individually, openings are formed in insulating layers 118 and 122 prior to depositing thermally conductive pillar section 702b and 702a, respectively.

Optional metal line 704 may be coupled between thermally conductive pillar 702 and thermally conductive pillar 706. The metal line 704 may be deposited over thermally conductive pillar 706, and may be formed at the same time as metal lines 114a and 114b. If metal line 704 is omitted, thermally conductive pillar 706 may extend from the substrate 102 to the thermally conductive pillar section 702b.

The thermally conductive pillar 706 is positioned between the substrate 102 and the thermally conductive pillar 702 to dissipate thermal energy into the substrate 102. The thermally conductive pillar 706 may comprise a thermally conductive material that is either electrically conductive or electrically nonconductive, so long as a sufficient portion of the overall thermal coupling between the heat source 701 and heat dissipation 708 impedes current from flowing from the metal line 124a to the substrate 102 and meets thickness needs for capacitive decoupling.

A plurality of structures may be utilized to transfer the thermal energy from heat source 701 to the substrate 102 to be dissipated as heat dissipation 708. The thermal energy originating from metal line 124a may be transferred to thermally conductive to the substrate 102 by conduction. In one embodiment, heat dissipation 708 is directed to the proximity of semiconductor devices which are less thermally active than the metal line 124a.

Figure 8:
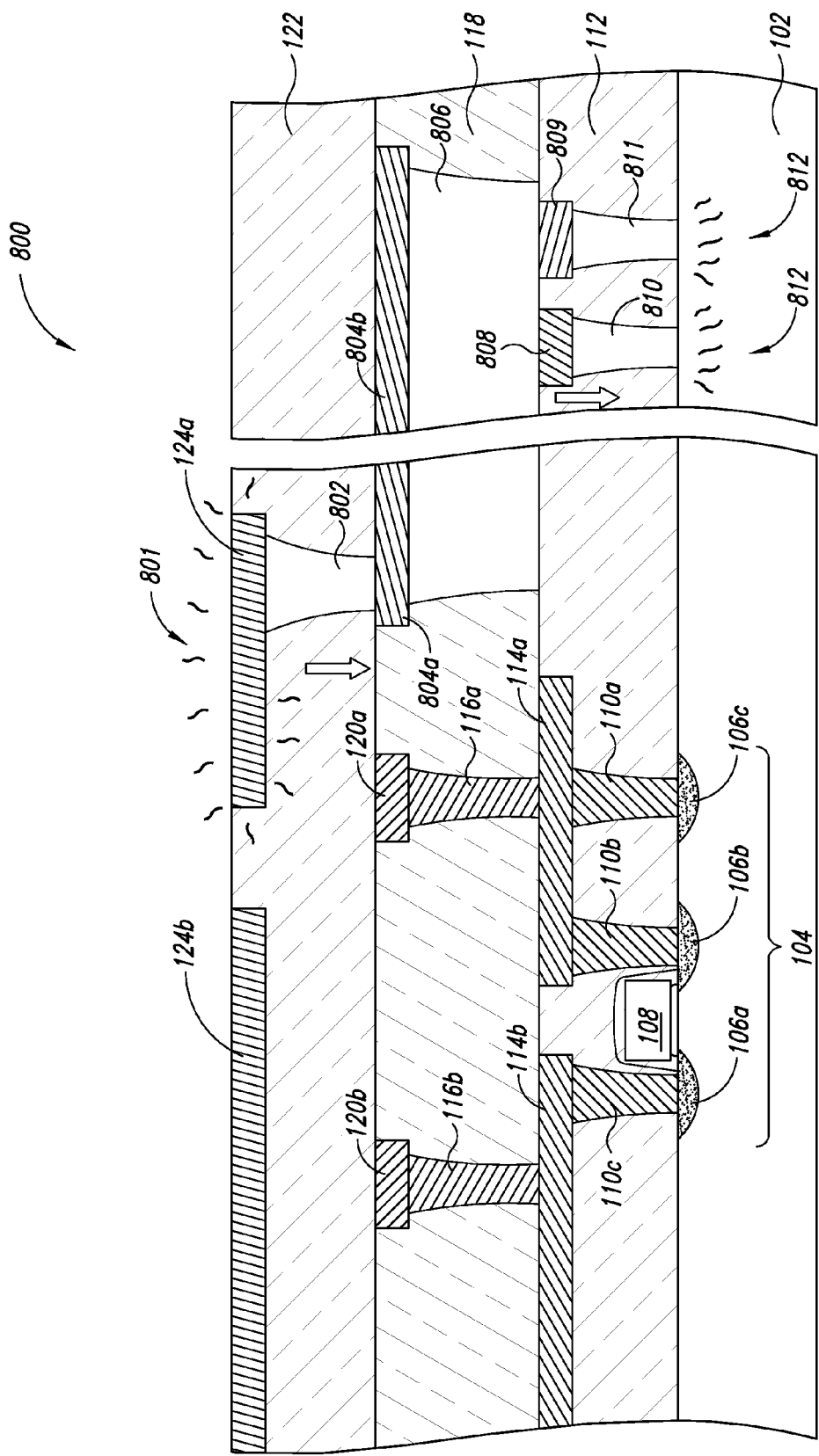

FIG. 8 illustrates a diagram of a heat transfer structure 800, in accordance with an embodiment of the invention. The heat transfer structure 800 includes a heat source 801, a thermally conductive pillar 802, dummy metal lines 804a and 804b, a thermally conductive pillar 806, a metal line 808, a metal line 809, a thermally conductive pillar 810, a thermally conductive pillar 811, and results in heat dissipation 812.

Thermally conductive pillar 802 is coupled between the metal line 124a and metal line 804a to transfer heat between the two lines. Thermally conductive pillar 802 may be formed by depositing a material in an opening formed in insulation layer 122. The material from which pillar 802 is formed may depend upon the materials selected when forming pillars 806, 810 and 811. For example, if either pillar 806, pillar 810, or pillar 811 are electrically nonconductive, then pillar 802 may comprise a tungsten plug, the metal used to form metal line 124a, or on electrically nonconductive material.

Dummy metal lines 804a and 804b may limited to transferring thermal energy from pillar 802 to pillar 806 rather than current. Dummy metal lines 804a and 804b may be used to position heat dissipation 812 in a substantially unused region of silicon substrate 102, such as near the scribe lines. Alternatively, dummy metal lines 804a and 804b may be used to position heat dissipation 812 in a region of the semiconductor circuit which is substantially less thermally active than the metal line 124a. The dummy metal lines 804a and 804b may be formed at the same time and may be formed of the same metal as metal lines 120a and 120b. In one embodiment, metal lines 804a and 804b are coupled together by intermediate metal lines and conductive plugs formed on different levels of the device. In another embodiment, metal lines 804a and 804b are formed at the same time and of the same metal layer.

Thermally conductive pillar 806 is positioned between the metal line 804b and thermally conductive pillars 810 and 811. Pillar 806 is formed in an opening in insulation layer 118. Pillar 806 is thermally conductive and may comprise an electrically conductive or nonconductive material. Pillar 806 may be substantially wider than pillars 802, 810, and 811.

Some chip manufactures deposit polygonal or cylindrical plug-like dummy structures formed of copper or the like to mitigate chemical mechanical polishing ("CMP") damage to non-dummy structures. Positioning CMP dummy structures on the periphery of the chip has been shown to decrease the "dishing" effect on non-dummy copper structures during CMP, resulting in a more even planarization. According to one embodiment, thermally conductive pillar 806 may be connected to the peripherally deposited CMP dummy structures to transfer thermal energy to the substrate.

Copper dummy structures are also deposited along the periphery of a die to form a wall between scribe line silicon and active silicon to absorb forces exerted by the scribe saw. In one embodiment, thermally conductive pillar 806 is connected to these copper dummy structures used to form a force absorption wall.

Optional metal lines 808 and 809 may be coupled between thermally conductive pillar 806 and thermally conductive pillars 810 and 811. Metal lines 808 and 809 may be deposited over thermally conductive pillars 810 and 811 and may be formed at the same time as metal lines 114a and 114b. If metal lines 808 and 809 are omitted, thermally conductive pillars 810 and 811 may extend from the substrate 102 to the thermally conductive pillar section 806.

The thermally conductive pillars 810 and 811 are positioned between the substrate 102 and the thermally conductive pillar 806 to dissipate thermal energy into the substrate 102. The thermally conductive pillars 810 and 811 may comprise a thermally conductive material that is either electrically conductive or electrically nonconductive, so long as a sufficient portion of the overall thermal coupling between the heat source 801 and heat dissipation 812 impedes current from flowing from the metal line 124a to the substrate 102.

A plurality of structures may be utilized to transfer the thermal energy from heat source 801 to the substrate 102, including more or less than those illustrated in the present embodiment while remaining within the spirit of the disclosed invention.

Figure 9A:
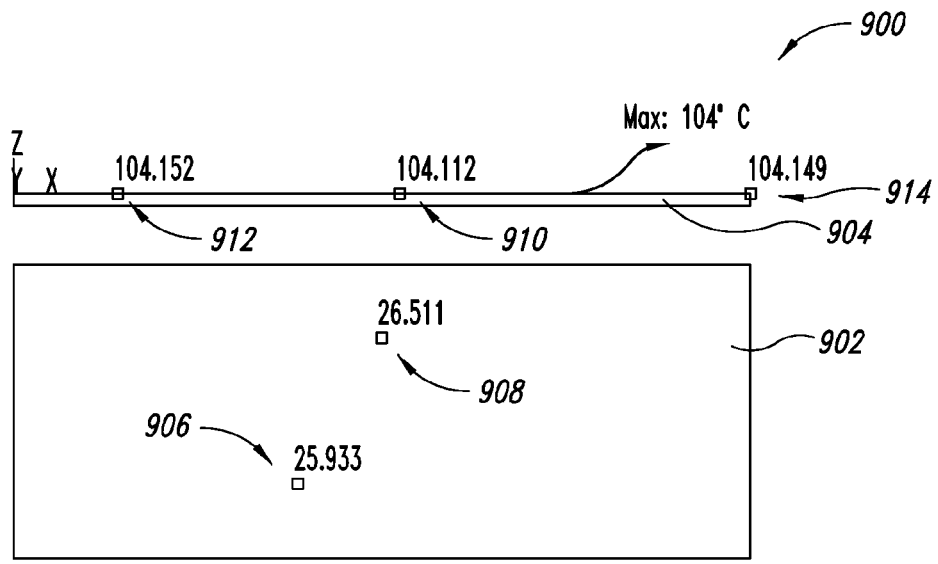
FIGS. 9A-9B illustrate results of thermal simulations run with and without the thermal conductive pillar, according to one embodiment of the invention.

FIG. 9A illustrates a thermal simulation 900 which may represent the embodiments of FIG. 1 while lacking a thermal transfer structure. The thermal simulation 900 includes a substrate 902, a metal line 904 and various temperature points 906, 908, 910, 912, and 914.

The substrate 902 represents the substrate of an entire die. The temperature point 906 is 25.933° C. and represents an average temperature of the substrate 902 that is essentially removed from metal lines and components of the circuit. The temperature point 908 is 26.511 and represents the temperature of the substrate 902 that may be susceptible to thermal influence by heat diffused from the metal line 904.

The metal line 904 represents all of the metal lines of the circuit disposed above the substrate 902. As shown by thermal points 910, 912, and 914 the average temperature of metal line 904 may be over 104° C. in the absence of a passive or active heat sink.

Figure 9B:
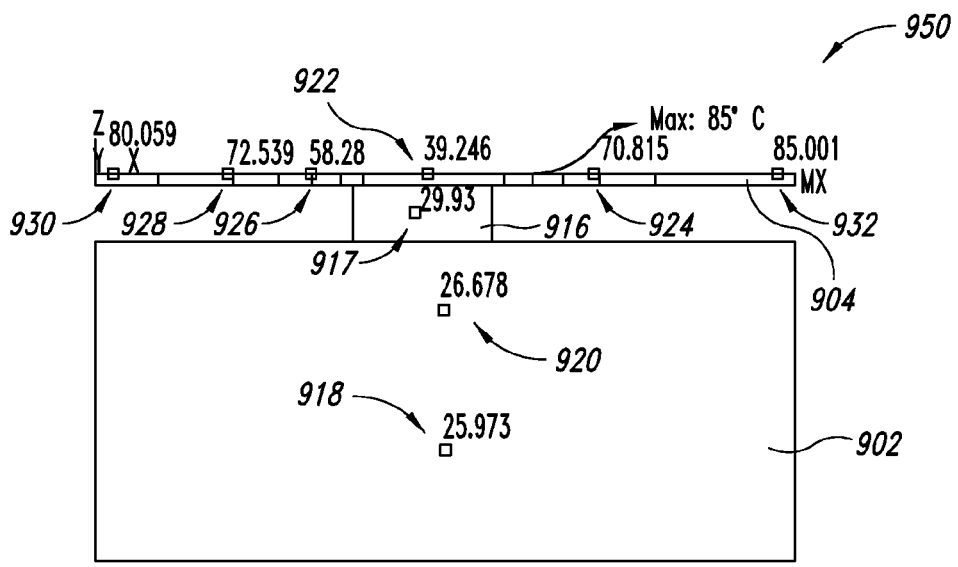

FIG. 9B illustrates a thermal simulation 950 which is representative of the previously disclosed embodiments of the invention. The thermal simulation 950 includes a substrate 902, a metal line 904, a thermally conductive pillar 916, and various temperature points 917, 918, 920, 924, 926, 928, 930, and 932.

The substrate 902 represents the substrate of an entire chip, such as one which may be implemented by any of the previously disclosed embodiments of the invention. The temperature point 918 is 25.973° C. and represents an average temperature of the substrate 902 that is essentially removed from the metal lines and components disposed over the substrate. The temperature point 908 is 26.511 and represents the temperature of the substrate 902 that is susceptible to thermal influence by heat diffused by the thermally conductive pillar 916.

The simulation of thermally conductive pillar 916 represents the cumulative influence of all thermal pillars in a circuit which are positioned to transfer heat from any metal line 904 to the substrate 902. As shown, thermal point 917 is 29.93° C. as measured approximately from the middle of the pillar 916. The temperature at thermal point 917 is substantially cooler than the temperature of the metal line 904 without a heat sink, 104.112° C. Thus, the thermal effect of the comparatively large substrate 902 can be seen on the pillar 916 which may be connected to the generator of undesired thermal energy, such as metal line 904.

The metal line 904 represents all of the metal lines of the circuit that are coupled to thermally conductive pillars 916. As shown by thermal points 922-932, the average temperature of a metal line coupled to the substrate via a silicon nitride pillar may be substantially reduced. For example, the thermal simulation 950 shows that the metal positioned directly over the thermally conductive pillar 916 exhibits a 62% reduction in temperature, from 104.112° C. to 39.246° C. Additionally, the regions of the metal line which are farthest away from the pillar 916 exhibit an 18% reduction in temperature, from 104.149° C. to 85.001° C.

The passive heat transfer techniques disclosed in various embodiments of the invention reduce undesirable side effects of trapped thermal energy. For example, the random motion of electrons due to thermal effects adds thermal noise to resistive communication structures. As another example, the temperature of a poly-poly capacitor may vary on the order of 20 ppm/° C., so the ability to redirect heat from a capacitor may effectuate tighter capacitive tolerances. As a another example, both carrier mobility and threshold voltages in MOSFETs are temperature dependent, so the current flowing through any MOSFET will be positively impacted by the ability to passively and substantially transfer heat from regions of thermal concern.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

We claim:

1. A semiconductor device, comprising:
a substrate including an active device;
a first metal layer overlaying the substrate, the first metal layer being configured to passively dissipate thermal energy;
at least one insulating layer disposed between the first metal layer and the substrate, the at least one insulating layer being electrically non-conductive; and
a thermally conducting pillar located in the at least one insulating layer and having a first end and a second end, the first end abutting the first metal layer and the second end abutting the active device and providing a thermal energy transfer path between the first metal layer and the active device, the thermally conducting pillar having a higher thermal conductivity than the insulating layer, the thermally conducting pillar being electrically non-conductive.

2. The semiconductor device of claim 1 wherein at least a second metal layer is positioned between the first metal layer and the substrate and the thermally conducting pillar includes more than one section.

3. The semiconductor device of claim 2 wherein a first section of the thermally conducting pillar thermally couples the first metal layer to the second metal layer and a second section of the thermally conducting pillar couples the second metal layer to the active device.

4. The semiconductor device of claim 3 wherein the second section of the thermally conducting pillar is coupled to the substrate through the active device.

5. The semiconductor device of claim 1 wherein the at least one insulating layer is a plurality of insulating layers.

6. The semiconductor device of claim 1, further comprising a heat conductive bump connected to the first metal layer to dissipate thermal energy.

7. The semiconductor device of claim 1 wherein the thermally conducting pillar is formed from silicon nitride.

8. The semiconductor device of claim 7 wherein the thermally conducting pillar is formed from a portion of polysilicon, the portion of polysilicon being disposed to increase the thermal conductivity of the thermally conducting pillar while preserving the electrical non-conductivity of the thermally conducting pillar.

9. The semiconductor device of claim 1 wherein the active device is a gate of a transistor.

10. A semiconductor circuit, comprising:
a substrate including an active device;
at least one electrical insulating layer overlying the substrate;
a first metal layer overlying the substrate, the first metal layer being configured to
passively dissipate thermal energy; and
a plurality of thermally conducting plugs, the plurality of thermally conductive plugs including a first plug having a first end abutting the active device and a second plug having a second end abutting the metal layer, the plurality of thermally conducting plugs providing a thermal energy transfer path between the first metal layer and the active device, the plugs having a higher thermal conductivity than the at least one insulating layer and providing an electrically high impedance between the active device and the first metal layer, the plurality of thermally conducting plugs being electrically non-conductive.

11. The semiconductor circuit of claim 10 wherein the plurality of thermally conductive plugs includes a third plug having a first end coupled to the send end of the first plug and a second end coupled to the first end of the second plug.

12. The semiconductor circuit of claim 11 wherein the thermal energy is transferred to a portion of the substrate proximate a scribe line region.

13. The semiconductor circuit of claim 11, further comprising a dummy metal line coupled to at least one of the plurality of thermally conducting plugs, the dummy metal line configured to facilitate thermal energy transfer from the first metal layer to the substrate.

14. The semiconductor circuit of claim 10 wherein the active device includes a transistor.

15. The semiconductor circuit of claim 14 wherein the transistor is a field effect transistor.

16. The semiconductor circuit of claim 13, further comprising a plurality of dummy metal lines coupled to at least one of the plurality of thermally conducting plugs, the plurality of dummy metal lines being configured to transfer thermal energy from the region of the substrate at least partially occupied by the active device to a second region of the substrate.

17. The semiconductor circuit of claim 14 wherein the first metal layer is positioned between the plurality of dummy metal lines and the substrate.

18. The semiconductor circuit of claim 10 wherein the active device is a component of a radio frequency device.

UNITED STATES PATENT AND TRADEMARK OFFICE
CERTIFICATE OF CORRECTION

PATENT NO.         : 8,680,673 B2
APPLICATION NO.    : 12/975194
DATED              : March 25, 2014
INVENTOR(S)        : Ravi Shankar et al.

It is certified that error appears in the above-identified patent and that said Letters Patent is hereby corrected as shown below:

In the Claims:

Column 14, Line 37:
"16. The semiconductor circuit of claim 13, further comprising" should read, --16. The semiconductor circuit of claim 15, further comprising--.

Column 14, Line 44:
"17. The semiconductor circuit of claim 14 wherein the first" should read, --17. The semiconductor circuit of claim 16 wherein the first--.

Signed and Sealed this
Twenty-fifth Day of November, 2014

Michelle K. Lee
*Deputy Director of the United States Patent and Trademark Office*